(12) United States Patent
Lee et al.

(10) Patent No.: US 7,676,208 B2
(45) Date of Patent: Mar. 9, 2010

(54) AUTOMATIC GAIN CONTROL DEVICE HAVING VARIABLE GAIN CONTROL INTERVAL AND METHOD THEREOF

(75) Inventors: Il-Gu Lee, Seoul (KR); Sok-Kyu Lee, Daejeon (KR); Hee-jung Yu, Daejeon (KR); Eun-Young Choi, Daejeon (KR); Chan-Ho Yoon, Seoul (KR); Jung-Bo Son, Masan (KR); Deuk-Su Lyu, Daejeon (KR); Seung-Wook Min, Seoul (KR); Tae-hyun Jeon, Sungnam (KR); Seung-Chan Bang, Daejeon (KR); Seung-Ku Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 594 days.

(21) Appl. No.: 11/636,201

(22) Filed: Dec. 8, 2006

(65) Prior Publication Data

US 2007/0135071 A1    Jun. 14, 2007

(30) Foreign Application Priority Data

Dec. 9, 2005    (KR)    ...................... 10-2005-0120851
Jun. 2, 2006    (KR)    ...................... 10-2006-0049865

(51) Int. Cl.
*H04B 1/06* (2006.01)
*H04Q 7/20* (2006.01)

(52) U.S. Cl. .................................... 455/234.1; 375/345

(58) Field of Classification Search ............. 455/232.1, 455/234.1–234.2, 246.1, 253.1; 375/345
See application file for complete search history.

(56) References Cited

U.S. PATENT DOCUMENTS

| 5,917,865 | A | 6/1999 | Kopmeiners et al. |
| 6,314,278 | B1 | 11/2001 | Zamat |
| 7,403,757 | B2 * | 7/2008 | Yu et al. .................. 455/232.1 |
| 7,463,704 | B1 * | 12/2008 | Tehrani et al. ............... 375/345 |

OTHER PUBLICATIONS

Fujii, M., et al., "Feedforward and feedback AGC for fast fading channels." Jun. 22, 1995. *Electronics Letters*, vol. 31, No. 13, pp. 1029-1030.

* cited by examiner

*Primary Examiner*—Lee Nguyen
(74) *Attorney, Agent, or Firm*—Ladas & Parry LLP

(57) ABSTRACT

An exemplary automatic gain control device includes: a radio frequency receiver for receiving a plurality of first signals through a plurality of antennas, respectively controlling gains of the plurality of first received signals, and outputting the plurality of the first signals having the controlled gain as a plurality of second signals; a signal saturation detecting unit for outputting a saturation index determination value when the number of plurality of second signals that are greater than a threshold value is greater than a predetermined number; and a gain controlling unit for comparing power values of the plurality of second signals to detect one power value, and outputting a gain value determined based on a detected power value and a saturation index determination value to the radio frequency receiver.

18 Claims, 13 Drawing Sheets

AUTOMATIC GAIN CONTROL DEVICE HAVING VARIABLE GAIN CONTROL INTERVAL AND METHOD THEREOF

CROSS-REFERENCE TO RELATED APPLICATION

This application claims priority to and the benefit of Korean Patent Application No. 10-2005-0120851 filed on Dec. 9, 2005, and No. 10-2006-0049865 filed on Jun. 2, 2006, in the Korean Intellectual Property Office, the entire contents of which are incorporated herein by reference.

BACKGROUND OF THE INVENTION (a) Field of the Invention

The present invention relates to an automatic gain control device having a variable gain control interval, and a method thereof. More specifically, the present invention relates to an automatic gain control device for a wireless local area network (WLAN) system having a multiplexing antenna and a single antenna, and a method thereof.

(b) Description of the Related Art

In general, a signal is distorted in a digital realm when a gain of a received signal is out of a dynamic range of an analog to digital converter (A/D converter), and when the gain is set to be low, demodulation performance is deteriorated since a quantization noise is increased.

Some of commercial variable gain amplifiers operate in the digital realm to perform a scaling operation for a digital signal. Due to a variable gain amplifier (VGA) and a low noise amplifier (LNA), a commercial radio frequency (RF) chip may have wider dynamic range, and it controls a signal gain of a receiving terminal. A cellular system performs an automatic gain control based on an estimation result obtained by using a pilot while a link is formed between a transmitting terminal and a receiving terminal, and a quick, accurate, and stable gain controlling method is required in a packet-based wireless communication systems including a wireless local area network (LAN) since it is required to finish a gain controlling operation within a short preamble period.

In an automatic gain control method used in continuous mode communication, an initial convergent time is long, but gain controlling performance is very good and stable. In addition, the automatic gain controlling method used in the packet-based wireless communication uses a method for gradually reducing a difference between a measured receiving power value and a desired signal power value.

However, it is difficult to use the above methods in a high speed packet communication system since the initial convergent time thereof is long. As described, in the prior art, gain controlling operations of the VGA and LNA that are usually used in the commercial RF chip may not be efficiently performed since a device for controlling an LNA gain state is not considered when a gain is controlled. In addition, since complexity of the above methods is high, it is not efficient to use the methods in a multiple antenna system.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an automatic gain control device for precisely and quickly controlling a level of a signal received in a wireless communication system having a multiplexing antenna, to be a target gain value, and a method thereof.

In addition, the present invention has been made in an effort to provide an automatic gain control device for establishing a gain control mode by a programmable register so that the automatic gain control device is used in a discrete RF module and a commercial RF chip, and for quickly controlling a gain by using an efficient gain control method and an LNA gain control state trace index when the commercial RF chip is used.

An exemplary automatic gain control device according to an embodiment of the present invention automatically controls a gain of a signal input through a plurality of antennas in a wireless communication system. The exemplary automatic gain control device includes a radio frequency receiver, a signal saturation detecting unit, and a gain controlling unit. The radio frequency receiver receives a plurality of first signals through a plurality of antennas, respectively controls gains of the plurality of first received signals, and outputs the plurality of first signals having the controlled gain as a plurality of second signals. The signal saturation detecting unit outputs a saturation index determination value when the number of the plurality of second signals that are greater than a threshold value is greater than a predetermined number. The gain controlling unit compares power values of the plurality of second signals to detect one power value, and outputs a gain value determined based on a detected power value and a saturation index determination value to the radio frequency receiver.

In an exemplary automatic gain control method for automatically controlling a gain of a signal input through a plurality of antennas in a wireless communication system, a) a first power value of at least one signal received from the plurality of antennas is measured, the measured first power value is converted into a logarithmic power value, the converted power value is output, and when the number of signals of at least one component among the components of the at least one received signal is greater than a predetermined number, the saturation index determination value is output; b) a gain determination value is output based on the logarithmic power value and the saturation index determination value, and a gain of the received signal is determined; and c) gain of the at least one received signal is controlled based on the determined gain.

DETAILED DESCRIPTION OF THE EMBODIMENTS

Figure 1:
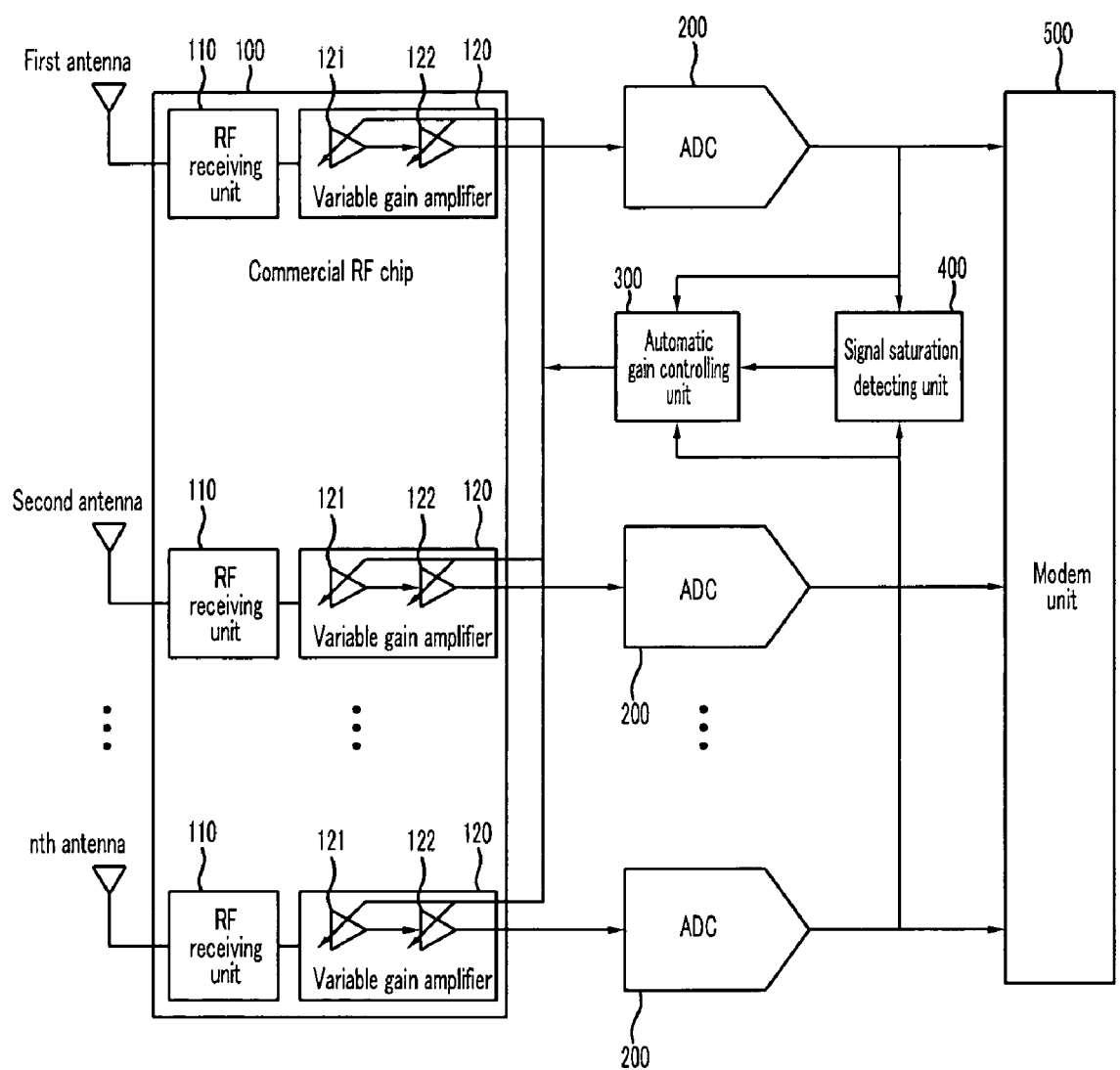
FIG. 1 shows a diagram of a configuration of the automatic gain controlling device for controlling a low noise amplifier (LNA) gain state and a variable gain amplifier (VGA) value of a commercial radio frequency (RF) chip according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims which follow, unless explicitly described to the contrary, the word "comprise", and variations such as "comprises" or "comprising", will be understood to imply the inclusion of stated elements but not the exclusion of any other elements.

In a single or multiplexing antenna wireless communication system, performance of a front end of a receiving terminal may greatly affect wireless communication system performance, including a system error rate and a coverage range. In addition, a receiving terminal configuration having a parameter optimized for a system and an efficient algorithm is one of important factors that determine system performance, price, and marketability. Since user requirements of high speed data information transmission have increased, a multiplexing antenna technique has been highly spot-lighted.

An automatic gain controlling device for performing an automatic gain controlling operation in a wireless communication system having multiplexing antennas according to two exemplary embodiments of the present invention will now be described with reference to FIG. 1 and FIG. 2.

The automatic gain controlling device is used in the wireless communication system in which an input signal varies within a wide dynamic range due to a channel distortion or a movement of a terminal. More particularly, in a system using a high speed packet-based orthogonal division multiplexing device such as a wireless local area network, a signal greatly varies when a packet is started.

The automatic gain controlling device in the high speed wireless communication system uses a signal-to-noise ratio (SNR) that is improved when recovering a received signal, and it maintains a baseband signal to be at a desired signal level. In addition, the automatic gain controlling device changes a gain of a receiver to maintain an output of the receiver to be at a desired level during one packet period regardless of an input of the receiver.

FIG. 1 shows a diagram of a configuration of the automatic gain controlling device for controlling a low noise amplifier (LNA) gain state and a variable gain amplifier (VGA) value of a commercial radio frequency (RF) chip according to an exemplary embodiment of the present invention.

As shown in FIG. 1, the automatic gain controlling device using commercial RF chip includes a commercial RF chip 100, an analog digital converter (ADC) 200, an automatic gain controlling unit 300, a signal saturation detecting unit 400, and a modem unit 500.

The commercial RF chip 100 receives a signal input through a plurality of antennas, and performs a function of fully using a dynamic range of the ADC 200 and generating an adjusted output having an optimum signal to noise ratio (SNR) regardless of an input signal level.

In this case, the commercial RF chip includes an RF receiving unit 110 and a variable gain amplifier 120 including an LNA amplifier 121 and a VGA amplifier 122. The RF receiving unit 110 receives the signal through the plurality of receiving antennas, performs a radio frequency signal process for converting the signal into a baseband signal, and transmits the baseband signal to the variable gain amplifier 120.

The LNA amplifier 121 has three gain control modes including high, medium, and low gain control modes. Since a dynamic rage for controlling gains is divided into the three modes as described, the LNA amplifier 121 may control a gain that is relatively higher than that of the VGA amplifier 122. In this case, the dynamic range of the LNA amplifier 121 is not limited to the three modes.

When the LNA amplifier 121 performs a coarse gain control operation, the VGA amplifier 122 performs a fine gain control operation. The fine gain control operation of the VGA amplifier 122 will be described with reference to FIG. 3. Since the LNA amplifier 121 and the VGA amplifier 122 are simultaneously used, a gain control range may be controlled according to requirements of a given system, and a quick and stable gain control operation may be performed.

The variable gain amplifier 120 adds a gain to an RF signal input from each RF receiving unit 110, and amplifies the RF signal including an in-phase (I) signal and a quadrature-phase (Q) signal. The gain added to the RF signal varies according to an input power value.

The ADC 200 converts the RF signal amplified by the variable gain amplifier 120 into a digital signal. Since the ADC 200 has a predetermined dynamic range rather than having an unlimited dynamic range, the gain is controlled so that the input signal is input according to the predetermined dynamic range.

The signal saturation detecting unit 400 outputs a saturation index determination value to the automatic gain controlling unit 300 when the number of signals having at least one component among I/Q components that is greater than a saturation threshold is greater than a saturation count reference.

The automatic gain controlling unit 300 receives the signal output through the signal saturation detecting unit 400 and the received signal converted by the ADC 200, controls the gain thereof, and applies the signals to the commercial RF chip 100 as a gain control input signal. That is, the automatic gain controlling unit 300 detects input signal amplitude variations of a receiver or an amplifier, automatically controls a gain so that output signal amplitude may be maintained at a predetermined level, and outputs it to the commercial RF chip 100.

Among constituent elements of the automatic gain controlling device using the commercial RF chip, the automatic gain controlling unit 300 and the signal saturation detecting unit 400 will be described with reference to the figures in further detail.

A configuration of the automatic gain controlling device using a discrete RF module will be described with reference to FIG. 2.

Figure 2:
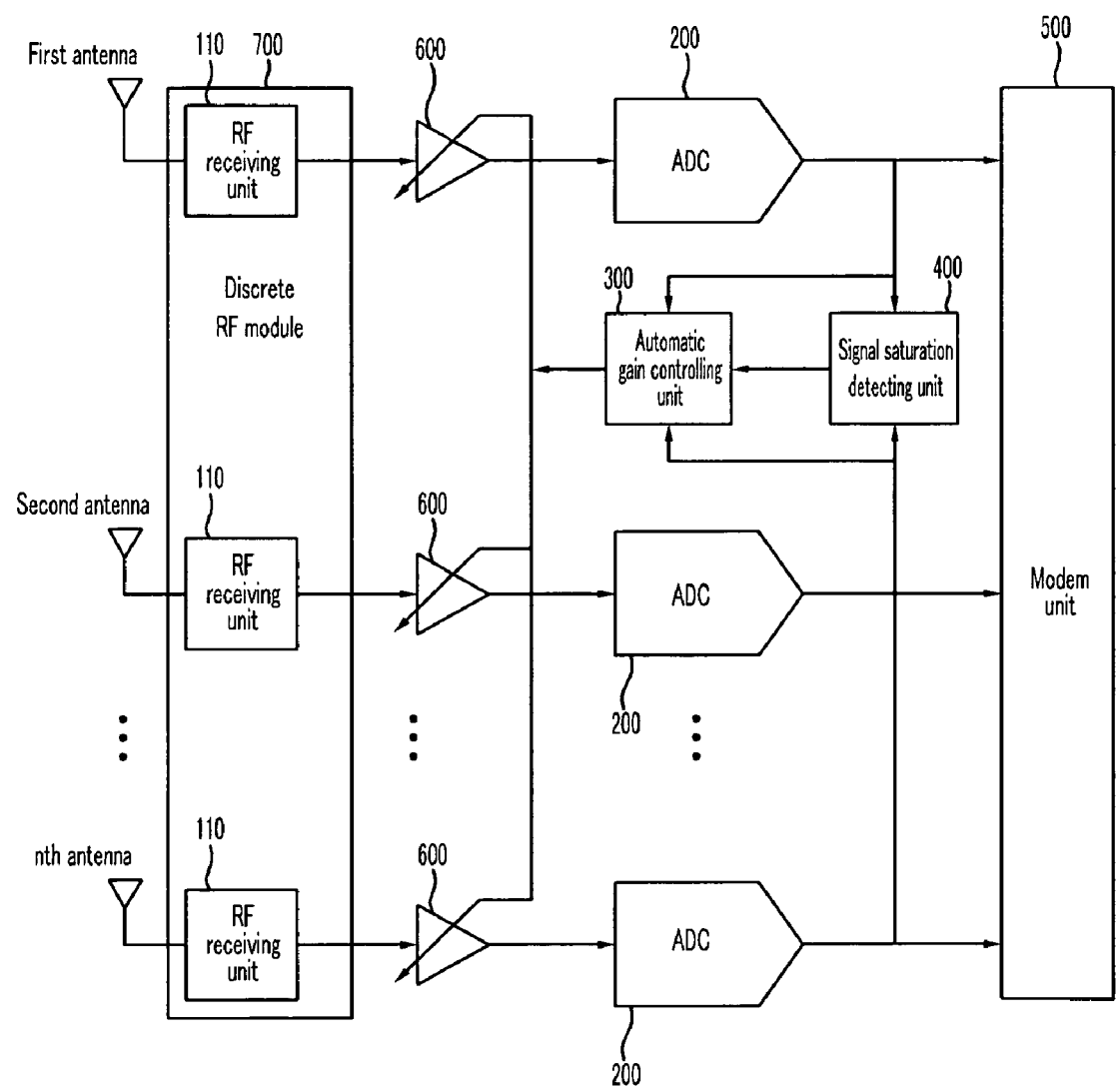
FIG. 2 shows a diagram of a configuration of the automatic gain controlling device for controlling a gain value of the discrete RF module according to the exemplary embodiment of the present invention.

FIG. 2 shows a diagram of a configuration of the automatic gain controlling device for controlling a gain value of the discrete RF module according to the exemplary embodiment of the present invention.

As shown in FIG. 2, the automatic gain controlling device using the discrete RF module includes a discrete RF module (also referred to as a discrete radio frequency receiving unit) 700, a digital variable gain amplifier 600, an ADC 200, an automatic gain controlling unit 300, a signal saturation detecting unit 400, and modem unit 500.

The automatic gain controlling device using the discrete RF module rather than the commercial RF chip shown in FIG. 1 uses a field programmable gate array (FPGA) to verify functions of a system. Differing from the commercial RF chip, the discrete RF module includes an analog amplifier of the RF receiving unit and a digital amplifier of a digital receiving unit.

The automatic gain controlling device according to the exemplary embodiment of the present invention is designed such that a register may control the gain control range required for the respective commercial RF chip and discrete RF module. In this case, it is required to change a gain control algorithm according to a predetermined register value, and to trace and control an input signal level.

The discrete RF module 700 includes the RF receiving units 110 corresponding to the number of a plurality of antennas, and the RF receiving unit 110 performs the radio frequency signal process for converting the signal received through each receiving antenna into the baseband signal. The digital variable gain amplifier 600 receives the respective received signals processed by the discrete RF module 700, adds the gains to the input signal. The gain may be varied according to the input power value.

The gain of the gain added signal is controlled by the ADC 200, the automatic gain controlling unit 300, the signal saturation detecting unit 400, and the modem unit 500.

Variations of control states of the automatic gain controlling unit 300 will be described with reference to FIG. 3.

Figure 3:
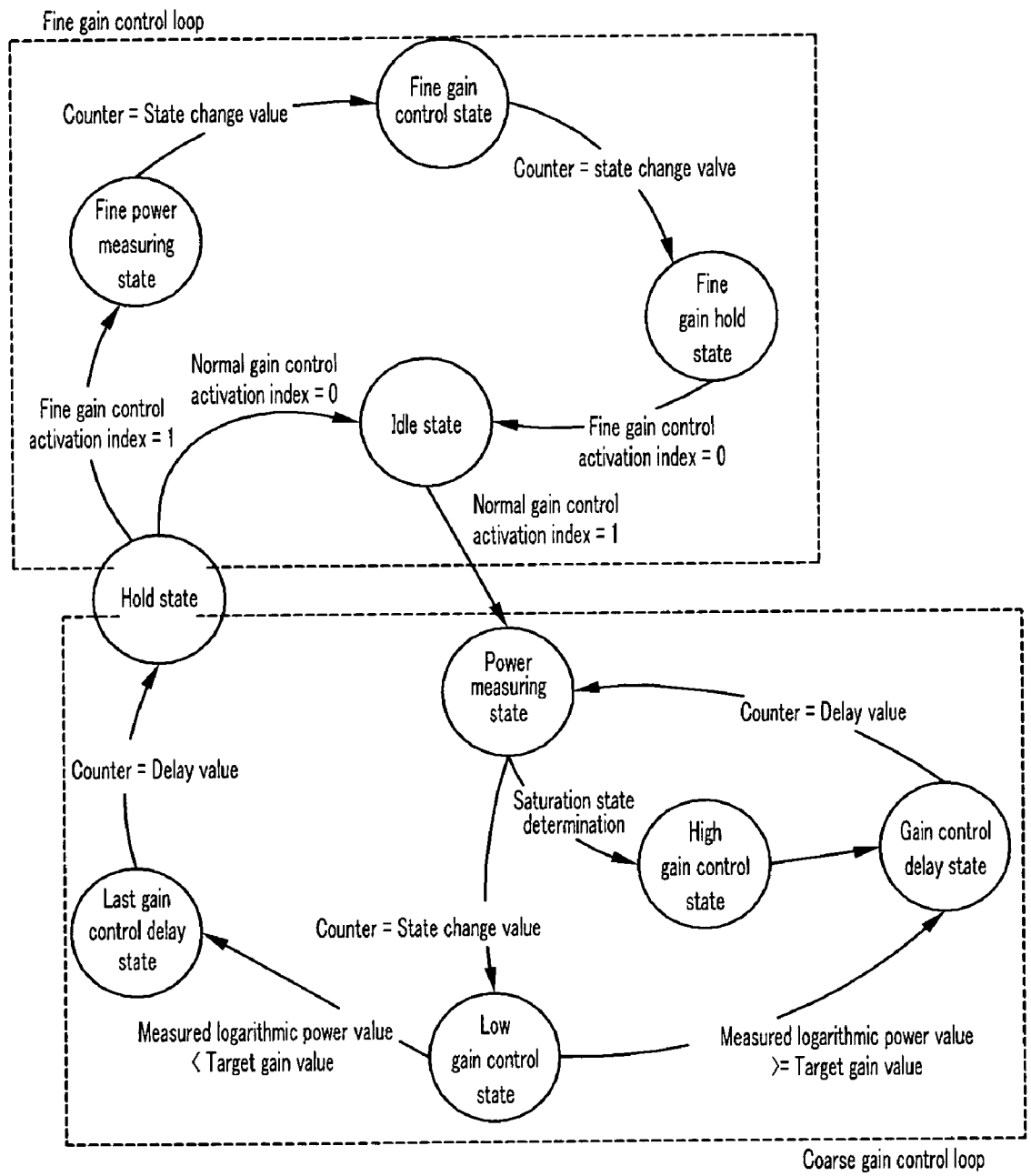
FIG. 3 shows a diagram for representing the control states of the automatic gain controlling unit according to the exemplary embodiment of the present invention.

FIG. 3 shows a diagram for representing the control states of the automatic gain controlling unit 300 according to the exemplary embodiment of the present invention.

The automatic gain controlling unit 300 changes the gain of the receiver to maintain the output of the receiver to be at a desired level regardless of the input of the receiver. In addition, the analog signals received through the plurality of multiplexing antennas are converted to digital signals within a predetermined dynamic range of the ADC 200, and the digital signals are controlled so that they may have an optimum signal to noise ratio without being affected by the input signal level.

Before the gain of the amplifier is controlled, a power value of the signal input through the antenna is measured by a power measuring unit 310 (shown in FIG. 5) of the automatic gain controlling unit 300 for a predetermined time. In the exemplary embodiment of the present invention, it is assumed that the power value of the input signal is measured for 0.8 us, but it is not limited thereto.

When a received packet supports the multiplexing antenna, a state of the automatic gain controlling unit 300 is changed from a hold state to a fine power measuring state, and a fine gain control operation is additionally performed. When the packet does not support the multiplexing antennas, the state is changed to an idle state, and no operation is performed when another packet is detected. In addition, when a gain control activation index is 0, the state is changed to the hold state.

When the gain control activation index becomes an activation state in the idle state, the state is changed to a power measuring state, and the power is measured for the given time. In this case, the power of the signal is measured by adding absolute values of the in-phase (I) and quadrature-phase (Q) components of the respective antenna signals.

The number of accumulated signals is determined by a dynamic frequency of the power measuring unit 310. A gain update performed by saturation of the ADC 200 is only performed when the saturation of the ADC 200 is detected during a signal power measuring period. When the ADC 200 is saturated while the power is measured, the power measuring operation is stopped, and the amplifier gain is reduced by a high gain.

When the ADC 200 is not saturated, the power measuring unit 310 compares power values of the signals received through the plurality of multiplexing antennas, and detects a greatest signal power value among the compared signal power values to perform the gain control. The detected signal power value is converted to a logarithmic power value. The detected logarithmic power value and a target power value are compared, and the gain is updated according to the compared value. To quickly perform the gain update, an additional low gain is added to a difference between the measured power value and the target power value when the measured power value is higher than the target power value, and the gain is further reduced.

In further detail, when the ADC 200 is saturated while the power is measured, the automatic gain controlling unit 300 stops measuring the power, and reduces the amplifier gain by the high gain value (agc_gainl_rx) set to be high among register values that are previously programmed. In addition, when the ADC 200 is not saturated during the power measuring period and the measured power value of the input signal is lower than the target power value (agc_vref_rx), the gain value is adapted to be equal to the register value (agc_vref_rx) given after the signal power is applied to the signal during a gain control period.

Further, when the ADC 200 is not saturated and the measured signal power value is higher than the target power value, the gain value is set to be equal to the register value (agc_vref_rx) given after the signal power is applied to the signal during the gain control period, and the gain value is reduced by the small gain value set to be an additional register value (agc_gains_rx). Since an additional gain suppress is performed as described above, the gain control is quickly performed when the received signal is high.

When the amplifier gain is updated by performing the gain control as described above, the automatic gain controlling device remains in the hold state during a gain control delay state value which is the programmed register value. In this case, the register value is great enough so that the received signal may cover changes of the updated gain value.

The signal power is measured and the gain is updated after the hold state, which are repeatedly performed until the measured power value is reduced to be less than the target power value. Here, an initial gain value initially applied to the received signal is given by an initial gain value which is the programmed register value.

When the packet is received through the multiplexing antennas, the fine gain control operation is additionally performed. That is, a loss is reduced by shortening a transmission time of the data packet, and a holding time (HT) short preamble fully using network throughput is used to perform a fine gain control loop (fine AGC tuning) once more. In this case, the power of the received signal is measured during a given time period (0.8 us). The gain is maintained after compensating the difference between the measured power value and the target power value until the packet transmission is finished, and the state is changed to the idle state when the packet transmission is finished.

The gain range is controlled after the power of the input signal is measured, and it may be controlled according to an automatic gain control mode value set to be a programmable register value (Agc_mode). Here, the gain range is controlled in three modes according to the Agc_mode value. When the Agc_mode value is 0, a 3 dB step gain control using the discrete RF module is performed. When the Agc_mode value is 1, a 2 dB step gain control using the discrete RF module is performed.

When the Agc_mode value is 2, the commercial RF chip is used. In this case, the digital amplifier is bypassed, and the LNA value and the gain value output from the automatic gain controlling unit 300 are used to control the VGA and LNA in the commercial RF chip 100. That is, the digital amplifier is used when the discrete RF module is used, and when the commercial RF chip is used, the digital amplifier is bypassed and an LNA state determination value and the gain value output from the automatic gain controlling unit 300 are used.

Constituent elements of the automatic gain controlling device shown in FIG. 1 and FIG. 2 will now be described. Firstly, the signal saturation detecting unit 400 will be described in further detail.

Figure 4:
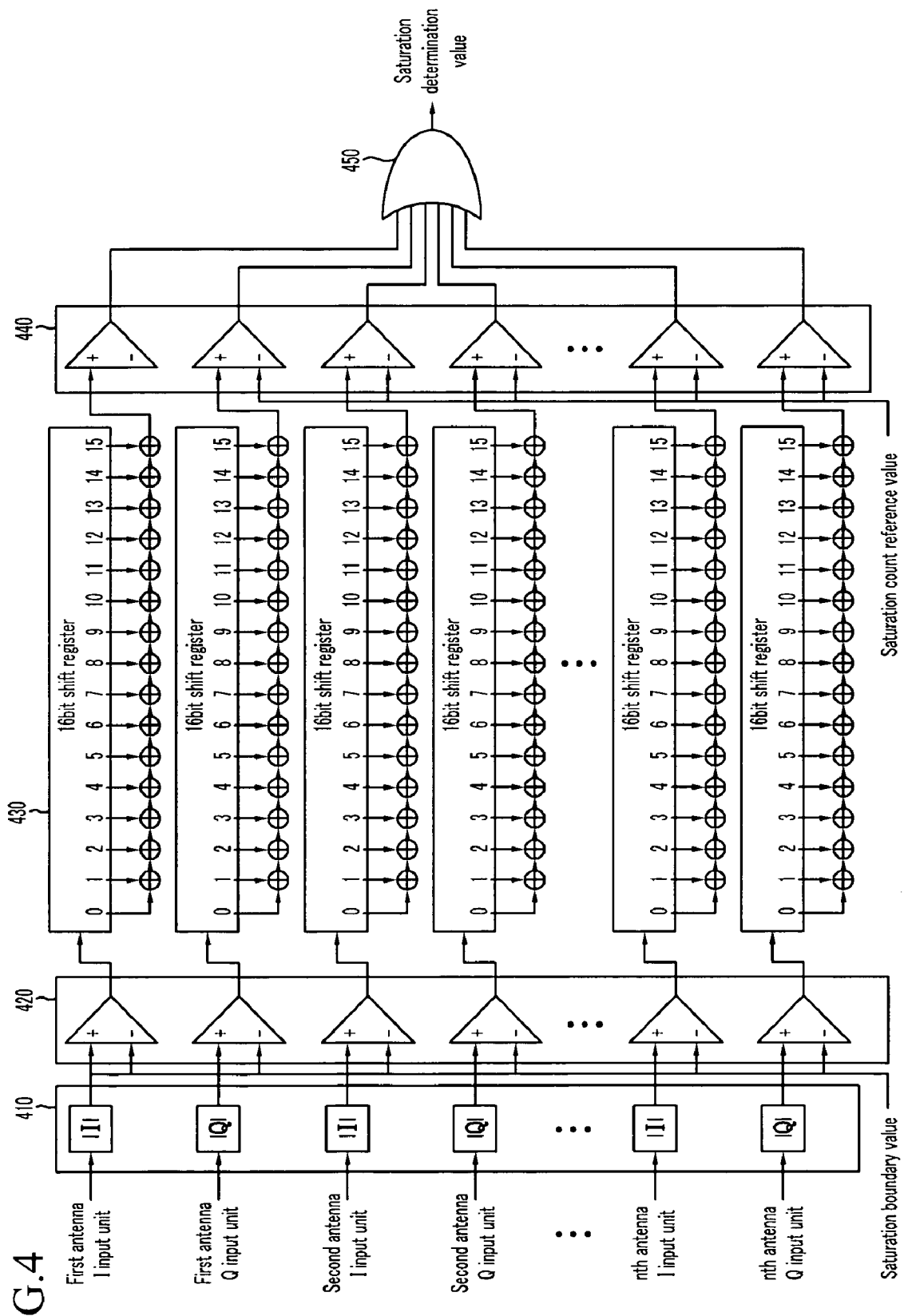
FIG. 4 shows a diagram of a configuration of the signal saturation detecting unit for determining whether the ADC is saturated, according to the exemplary embodiment of the present invention.

FIG. 4 shows a diagram of a configuration of the signal saturation detecting unit 400 for determining whether the ADC is saturated, according to the exemplary embodiment of the present invention.

Referring to FIG. 4, the signal saturation detecting unit 400 includes a first absolute value obtaining unit 410, comparing units 420 and 440, a counter 430, and an OR gate 450.

The first absolute value obtaining unit 410 calculates an absolute value of the I/Q components of the received signal that is sequentially output from the ADC 200. The comparing units 420 and 440 compare the absolute value and a saturation boundary value, and outputs 1 when the absolute value is greater than the saturation boundary value.

The counter 430 increases a number by one when an output of the comparing unit 420 is 1, outputs a total counted value, and outputs the number of signals having an absolute value that is greater than a saturation signal. The comparing unit 440 compares an output of the counter 430 and a saturation count reference value, and outputs 1 when the output of the counter 430 is greater than the saturation count reference value. The OR gate 450 outputs 1 as a saturation index determination value to the automatic gain controlling unit 300 when one among outputs of the comparing unit 440 is 1.

The above processes are repeatedly performed for a predetermined number of signals until a final gain is determined. The signal saturation detecting unit 400 detects whether a signal is input to the receiving terminal, or monitors whether the ADC is saturated. To improve reliance on the ADC saturation detection, 16 sequential signals sampled at 40 MHz are used.

For example, when one signal component (e.g., a real component of an antenna 0) is considered, it is determined that the ADC is saturated when the number of ADC output signals having an absolute value greater than a predetermined threshold value (cs_th_sat_rx)/2 of the saturation signal is greater than a programmed register value cs_th_cnt_sat_rx. Here, the value (cs_th_sat_rx)/2 is a threshold value when the ADC is saturated. The ADC saturation may be detected by any one among real and imaginary components input through three antennas (i.e., 6 signal components).

The automatic gain controlling unit 300 shown in FIG. 1 will now be described with reference to FIG. 5, in further detail.

Figure 5:
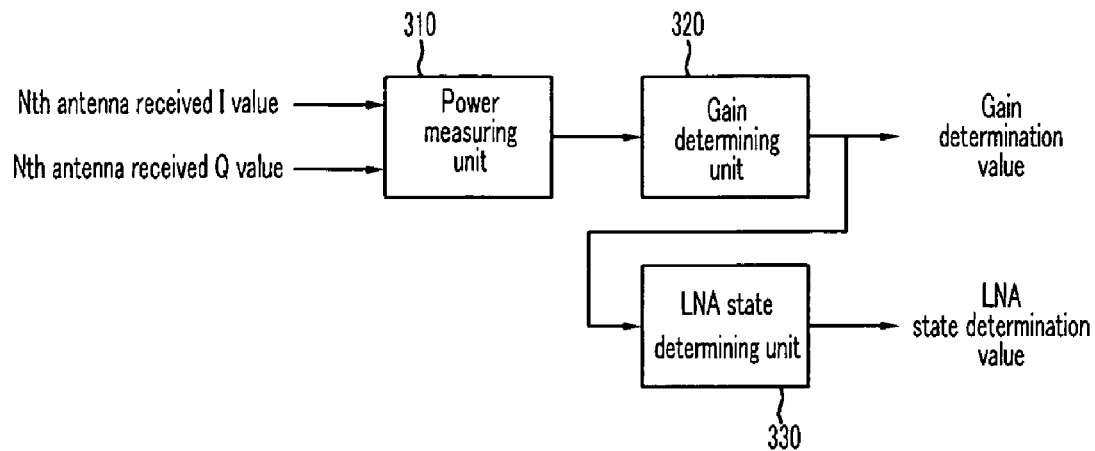
FIG. 5 shows a diagram of a configuration of the automatic gain controlling unit according to the exemplary embodiment of the present invention.

FIG. 5 shows a diagram of a configuration of the automatic gain controlling unit 300 according to the exemplary embodiment of the present invention.

As shown in FIG. 5, the automatic gain controlling unit 300 includes a power measuring unit 310, a gain determining unit 320, and an LNA state determining unit 330.

The power measuring unit 310 receives the I/Q components of the received signal received through the plurality of antennas, compares absolute values of power thereof, detects the greatest power, converts the detected power into a logarithmic value, and outputs it to the gain determining unit 320.

The power measuring unit 310 will now be described with reference to FIG. 6, in further detail.

Figure 6:
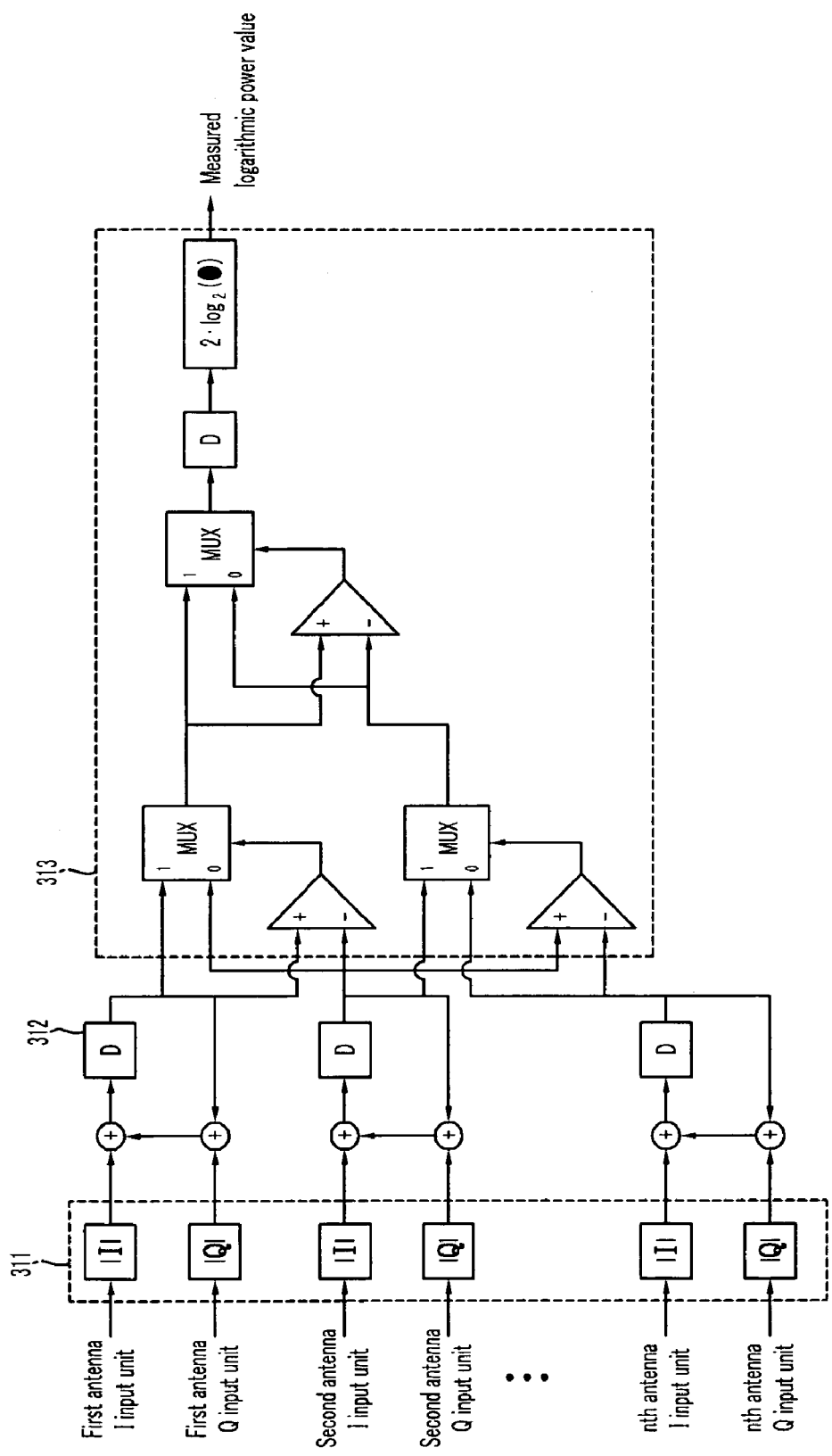
FIG. 6 shows a diagram of a configuration of the power measuring unit according to the exemplary embodiment of the present invention.

FIG. 6 shows a diagram of a configuration of the power measuring unit 310 according to the exemplary embodiment of the present invention.

In FIG. 6, the power measuring unit compares the absolute values of input signal power of n antennas of the wireless communication system having multiplexing antennas, selects received power of an antenna having the greatest power among the compared values, and extracts a logarithmic measured power. Complexity may be reduced to less than a squaring operation since the power measuring unit uses the absolute value, and the number of bits may be reduced since it has a logarithmic resulting value.

As shown in FIG. 6, the power measuring unit 310 includes a second absolute value obtaining unit 311, a delay unit 312, and a measured power extractor 313.

The second absolute value obtaining unit 311 calculates the I/Q components of the received signals sequentially output from the ADC 200. An XOR calculation is performed for the signals of the I/Q components calculated as the absolute values by the second absolute value obtaining unit 311, and the signals are input to the delay unit 312.

The measured power extractor 313 includes a plurality of multiplexers, a plurality of comparators, a delaying unit, and a logarithmic calculator. The comparator receives a delayed value of an I component signal of a first antenna and a Q component signal of the first antenna and a delayed value of an I component signal of a second antenna and a Q component signal of the second antenna, compares the delayed values, and outputs the greater value.

The multiplexer receives the output value, multiplexes the delayed value of the first antenna and the delayed value of the second antenna, and outputs a multiplexed value. In this way, comparing and multiplexing operations are performed until an output becomes one by comparing neighboring input signals of n antennas. One value output through the multiplexer is input to the logarithmic calculator, and a corresponding signal is output as a logarithmic power value.

The gain determining unit 320 shown in FIG. 5 determines a gain from a saturation index determination value and a difference between a reference power and a received power. The gain determining unit 320 will now be described with reference to FIG. 7, in further detail.

Figure 7:
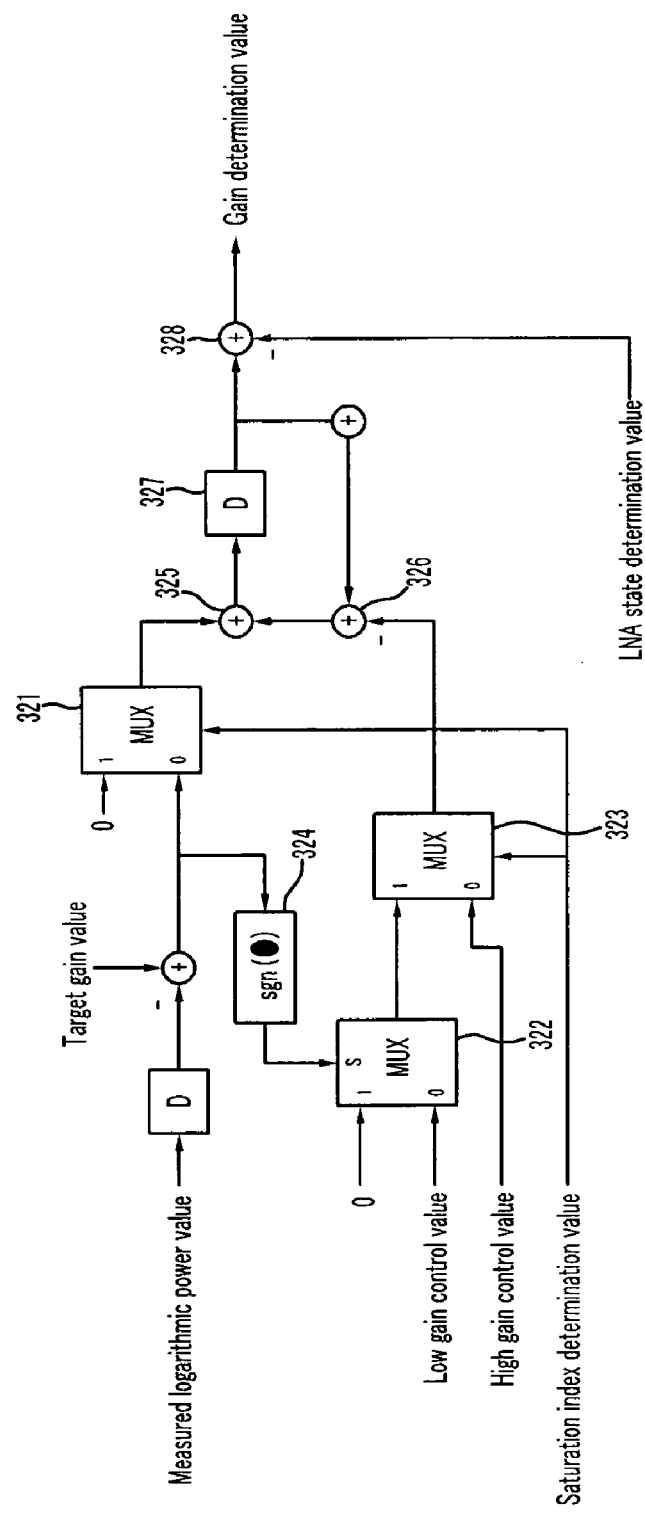
FIG. 7 shows a diagram of a configuration of the gain determining unit for performing a high gain control according to a saturation index determination value, or performing a small gain control by comparing the measured power value and the target gain value.

FIG. 7 shows a diagram of a configuration of the gain determining unit for performing a high gain control according to a saturation index determination value, or performing a small gain control by comparing the measured power value and the target gain value.

As shown in FIG. 7, the gain determining unit 320 includes a first multiplexer 321, a sign determining unit 324, a second multiplexer 322, a third multiplexer 323, an adder 325, a first subtractor 326, a delay unit 327, and a second subtractor 328.

The first multiplexer 321 outputs 0 when receiving the saturation index determination value from the signal saturation detecting unit 400, and it outputs a difference between the target gain value and the logarithmic power value output from the power measuring unit 310 when not receiving the saturation index determination value.

The sign determining unit 324 determines a sign according to a resulting value obtained by the difference between the target gain value and the logarithmic power value output. That is, it outputs 1 when the sign is "+", and outputs 0 when the sign is "−".

The second multiplexer 322 outputs 0 when the sign determined by the sign determining unit 324 is negative, and outputs the small gain (AGC_gain_small) when the sign is positive. The third multiplexer 323 outputs a high gain controlling value when receiving the saturation index determination value, and outputs an output signal of the second multiplexer 322 when not receiving the saturation index determination value.

The adder 325 adds an output of the first multiplexer 321 and an output of the third multiplexer 323, and outputs the added value to the delay unit 327. The first subtractor 326 subtracts the output of the third multiplexer 323 from a current determination gain delayed and input from the delay unit 327, and outputs the subtracted value to the adder 325. The second subtractor 328 subtracts an LNA state determination value output from the LNA state determining unit 330 from an output signal of the delay unit, and outputs the subtracted value as a gain determination value. The output gain determination value is input to the LNA state determining unit 330 shown in FIG. 5.

In this case, since the output of the first multiplexer 321 is 0 and the third multiplexer 323 selects the high gain when the gain determining unit 320 receives the saturation index determination value while the power measuring unit 310 measures the power of the received signal, the current determination gain is obtained by subtracting the high gain from a determination gain. That is, an initial gain is reduced by the high gain.

When the saturation index determination value is not input to the gain determining unit 320 and a difference between reference power and received power is negative while the power measuring unit 310 measures the power of the received signal, the difference between the reference power and the received power is added to the determination power, and the small gain is subtracted therefrom so as to obtain a new determination gain. That is, since a digital received signal is not within the dynamic range of the ADC and the power of the digital received signal may be measured to be lower than actual power when the received power is higher than the reference power, the gain determining unit 320 further reduces the gain.

When the difference between the reference power and the received power is positive, the gain determining unit 320 adds the difference to the determination gain to set a new determination gain. The gain set as above is maintained as a final gain before a corresponding packet is finished.

The gain determined by the gain determining unit 320 is determined when an analog signal is converted into a digital signal, and an actual gain is controlled according to the input power of the variable gain amplifier that processes an analog signal.

The LNA state determining unit 330 shown in FIG. 5 will now be described with reference to FIG. 8, in further detail.

Figure 8:
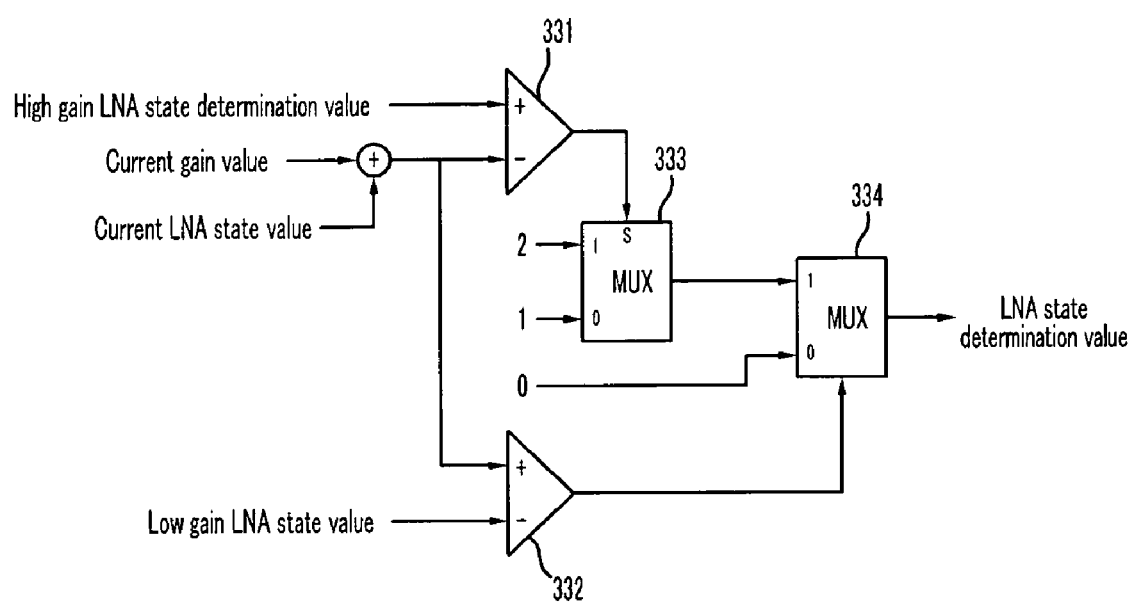
FIG. 8 shows a diagram of a configuration of the LNA state determining unit for calculating an LNA state control index based on a current LNA state determination value and a current gain, and determining a subsequent LNA state determination value, according to the exemplary embodiment of the present invention.

FIG. 8 shows a diagram of a configuration of the LNA state determining unit 330 for calculating an LNA state control index based on a current LNA state determination value and a current gain, and for determining a subsequent LNA state determination value, according to the exemplary embodiment of the present invention.

As shown in FIG. 8, the LNA state determining unit 330 includes a first comparator 331, a second comparator 332, a fourth multiplexer (MUX) 333, and a fifth MUX 334.

The first comparator 331 receives a sum of the current gain value and the current LNA state value and a high gain LNA state boundary value, and compares the two values. The second comparator 332 receives the sum of the current gain value and the current LNA state value and a low gain LNA state boundary value.

After comparing the two values by the first comparator 331, 1 is input to the fourth MUX 333 when a "+" sign of the compared value is obtained, and 2 is input to the fourth MUX 333 when a "−" sign is obtained. After comparing the two values by the second comparator 332, 1 is input to the fifth MUX 334 when the sign is negative, and 0 is input to the fifth MUX 334 when the sign is positive. Accordingly, the LNA state is determined to be 0, 1, or 2 by the LNA state determining unit 330, and 0, 1, and 2 respectively indicate a low gain mode, a medium gain mode, and a high gain mode.

The determined LNA state determination value is input to the gain determining unit 320 shown in FIG. 7.

The digital variable gain amplifier of the automatic gain controlling device using the discrete RF module shown in FIG. 2 will now be described with reference to FIG. 9, in further detail.

An output signal of the ADC 200 is used to control a signal gain in the automatic gain controlling unit 300, and a digital gain control signal is converted to an analog control signal by a digital analog converter (not shown) to control a gain of an analog amplifier. In the exemplary embodiment of the present invention, an amplifier for using the gain obtained by the automatic gain controlling unit 300 to apply it to an output of the ADC 200 at a digital end.

Figure 9:
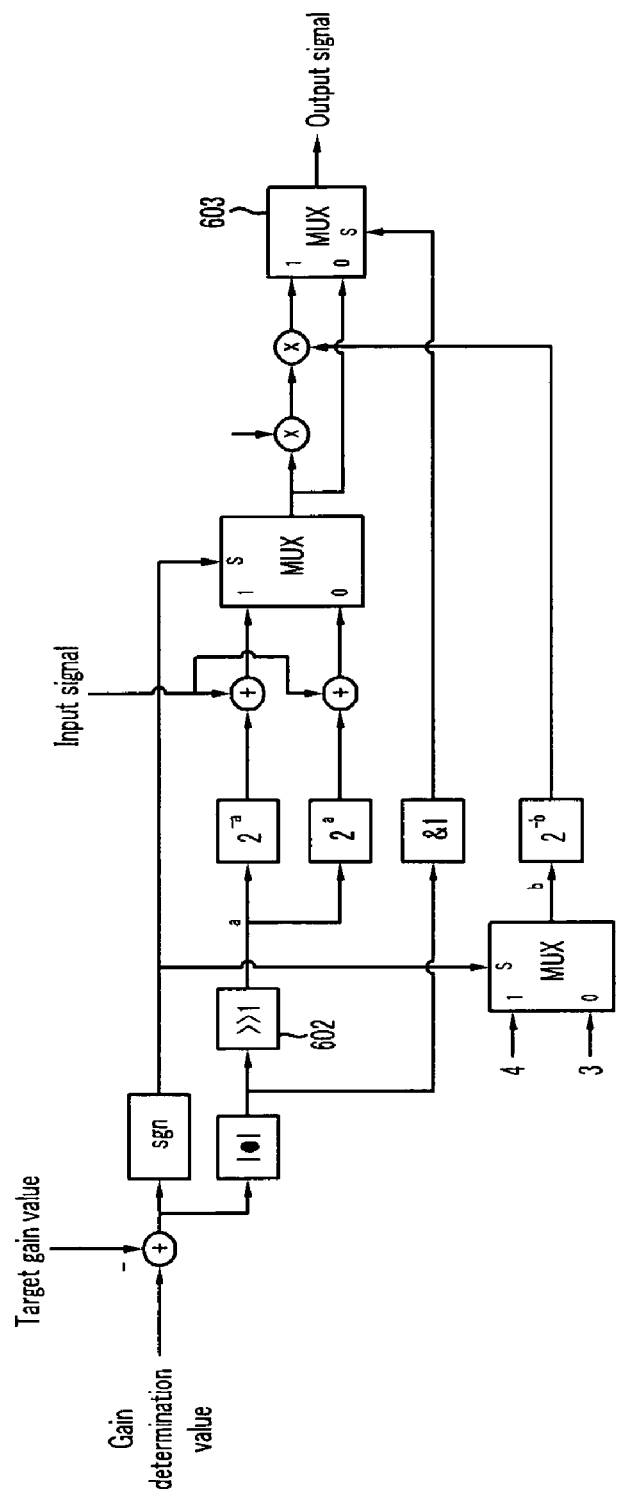
FIG. 9 shows a diagram of the digital variable gain amplifier of the automatic gain controlling device using the discrete RF module according to the exemplary embodiment of the present invention.

FIG. 9 shows a diagram of the digital variable gain amplifier of the automatic gain controlling device using the discrete RF module according to the exemplary embodiment of the present invention.

As shown in FIG. 9, the digital variable gain amplifier is used to measure the amplified or reduced input signal power, and controls the power to be a target power by a programmable register according to the current gain state. Here, the digital variable gain amplifier differently operates in three Agc_modes.

When the Agc_mode is 0, the 3 dB step gain control using the discrete RF module is performed, and 2, ½, sqrt 2, and 1/sqrt 2 times gain controls are performed as a simple shift operation. When the Agc_mode is 1, the 2 dB step gain control using the discrete RF module is performed, and 1.585 and 1/1.585 times gain controls are performed. The digital amplifier is not used since the commercial RF chip performs the gain control when the Agc_mode is 2.

When the digital variable gain amplifier 600 is presently described, it is assumed that the gain control value is divided into two steps of gain_6 dB and gain_3 dB. Firstly, an input gain control value gain_fx obtains −20 to be set as a dgain, and an absolute value calculator |.| uses an absolute value of the dgain to obtain a udgain.

The gain_6 dB (i.e., "a" in FIG. 9) is obtained by right-shifting the obtained udgain by 1 by a shift operator 602, 4 is set as the gain_3 dB when the dgain is less than 0, and 3 is set as the gain_3 dB when the dgain is not less than 0.

The gain is controlled to be small since the input signal is not within the dynamic range of the ADC 200 when the dgain is a negative number, and the gain is increased since the input signal does not fully use the dynamic range of the ADC when the dgain is a positive number. That is, a value input from the ADC 200 is divided by a value obtained by left-shifting 1 by the gain_6 dB when the dgain is less than 0, and is multiplied by the value obtained by left-shifting 1 by the gain_6 dB when the dgain is not less than 0. When a least significant bit (LSB) is 0, the value input from the ADC 200 is output without any change.

Accordingly, since the 6 dB step gain control is basically performed and the 3 dB step gain control is performed once at the end, the complexity may be reduced. A value calculated as above is multiplied by 11 and is divided by a value obtained by left-shifting 1 by the gain_3 dB when the LSB of udgain is 1, and is used as it is when the LSB is 0. A MUX 603 clips a value calculated as above by 512 and −512 and outputs the clipped value.

The automatic gain controlling device according to the exemplary embodiment of the present invention may selectively uses a gain control interval by setting a programmable register. When the automatic gain control mode is the commercially available RF chip mode, the LNA state trace index is calculated by the current gain value and the current LNA state determination value. The VGA gain and the LNA gain control mode of the commercial RF chip using the gain value and the LNA gain control mode shown in FIG. 10 and FIG. 11 according to the exemplary embodiment of the present invention determine the LNA state as shown in a flow chart of FIG. 12.

A VGA gain determination required for determining the LNA state will now be described with reference to FIG. 10.

Figure 10:
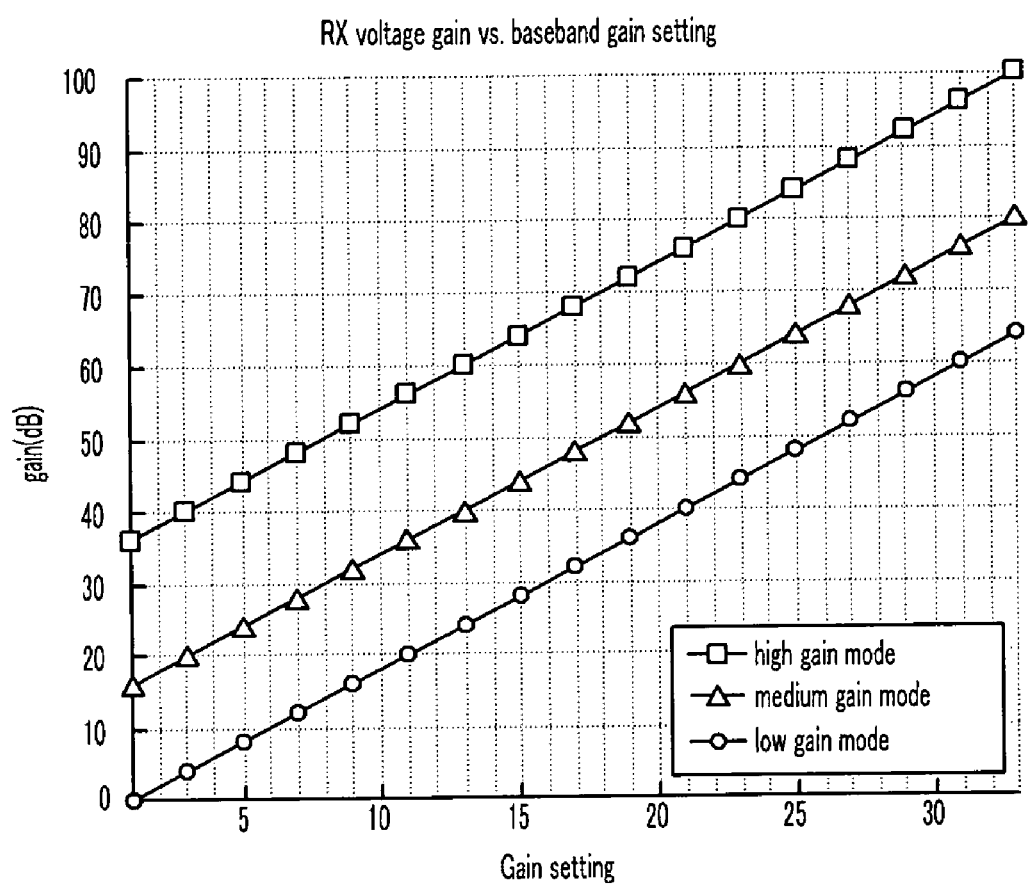
FIG. 10 shows a graph representing the VGA gain of the commercial RF chip.

FIG. 10 shows a graph representing the VGA gain of the commercial RF chip.

As shown in FIG. 10, the X axis is a baseband gain setting, and the Y axis is an RX power gain. In FIG. 10, referring back to FIG. 3, when an agc_en is 1 at the idle state, the state is changed to a power measuring state, and the power is measured for 0.8 us. The power of the input signal is measured by accumulation of absolute values of real and complex parts of the respective antenna signals.

The number of accumulated signals is 32, which is sampled at 40 MHz. The gain update by the ADC saturation is performed when the ADC saturation is detected in a signal power estimation range.

When the ADC is saturated while the power measuring unit 310 measures the power of the input received signal, the power measuring unit 310 stops measuring the power, and the amplifier gain is reduced by the agc_gainl_rx. When the ADC is not saturated, a greatest value among the estimated signal power values of the respective antennas is selected to update the gain. The selected signal power value is converted to a logarithmic value.

In the exemplary embodiment of the present invention, one of the gain steps of 3 dB and 2 dB is selected by the programmable register, but it is not limited thereto. The 3 dB step gain control is selected when the discrete RF module is used, and the 2 dB step gain control is selected when the commercial RF chip is used.

The estimated logarithmic power and the target power agc_vref_rx are compared, and the gain is updated according to the compared value. To quickly update the gain, the gain is suppressed by additionally adding the gain agc_gains_rx to the difference between the estimated power and the target power when the estimated power is greater than the target power agc_vref_rx.

When it is detected by auto-detection that a high throughput signal (HT-SIG) is received, a value ht_val is received from a receive finite state machine rx_fsm (not shown), and the rx-fsm sets a value f_agc_en to be high and transmits it to the automatic gain controlling unit 300. The hold state is changed to the idle state in a case of a legacy mode, and is changed to the fine power measuring state (F_MSR) in a case of an independent mode, so as to perform a fine gain control loop. In the fine power measuring state, the power is measured for 32 samples, which are each one short preamble period, after 0.8 us that is given as a guard interval (GI) of an HT short preamble.

The difference between the measured power and the target power is compensated, and the state is changed to a fine gain hold state (F_HOLD). In the fine gain hold state, the state is maintained until the f_agc_en becomes 0, and is changed to the idle state. A state machine of the automatic gain controlling unit 300 generates a signal to control each block.

An LNA gain control operation required for determining the LNA state will now be described with reference to FIG. 11. The LNA state is determined by comparing a gain control mode boundary value and the LNA state trace index.

Figure 11:
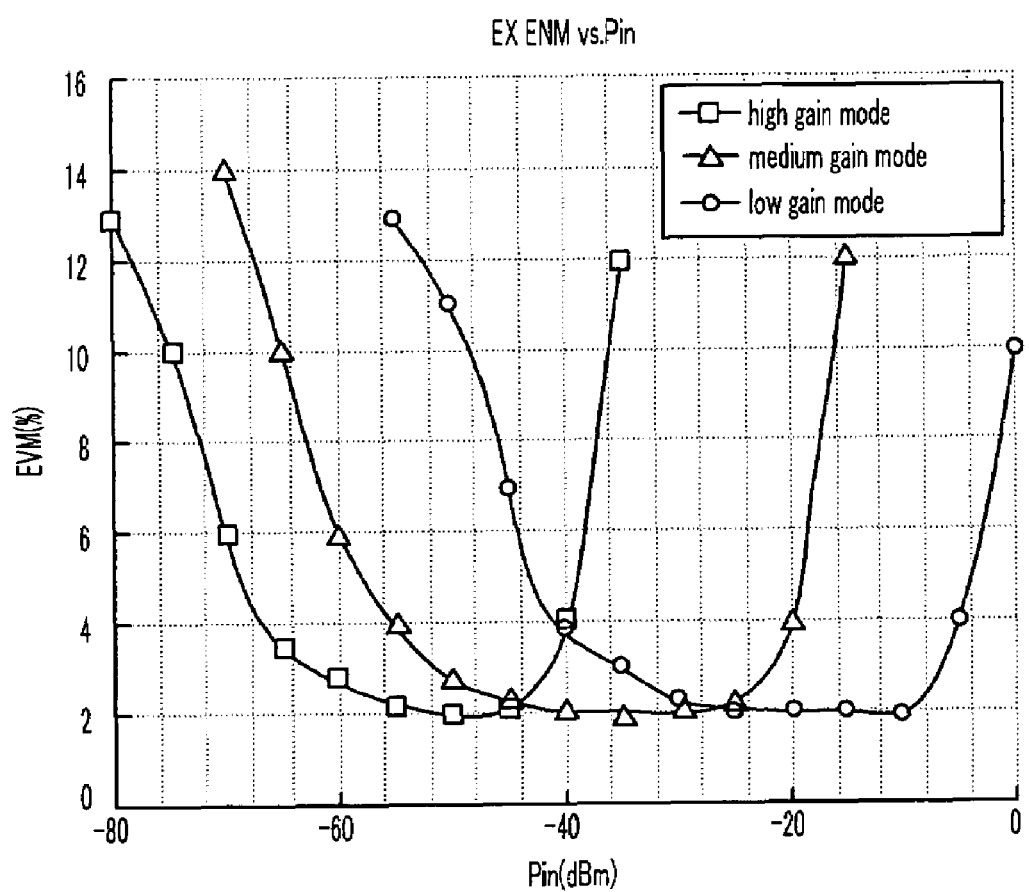
FIG. 11 shows a graph representing LNA gain determination of the commercial RF chip according to the exemplary embodiment of the present invention.

FIG. 11 shows a graph representing LNA gain determination of the commercial RF chip according to the exemplary embodiment of the present invention.

As show in FIG. 11, the gain control mode boundary point is determined to be −45 dBm and −24 dBm. That is, when the current LNA state is in the high gain mode and the LNA state trace index is calculated to be higher than −45 dBm and to be lower than −24 dBm, a subsequent LNA state value is set to be in the medium gain mode.

In this case, when the LNA state trace index is calculated to be higher than −24 dBm, the subsequent LNA state value is set to be in the low gain mode. Accordingly, the LNA state determination value may be efficiently traced based on the LNA state trace index.

That is, when the Agc_mode is 2, the AGC selects and transmits the gain value and appropriate LNA mode. In this case, the LNA mode is selected by a tracking method, and gain_t (gain_t=gain+LNA) is calculated by the selected LNA mode. The graph in FIG. 11 shows error vector magnitude (EVM) performance of each LNA mode, which determines an optimum gain mode.

Deleted Texts

That is, when gain_t is greater than 27, the LNA is set to be 3, which means the received signal is at a low level, and therefore the LNA operates in the high gain mode. When gain_t is between 19 and 27, the LNA is set to be 2 and operates in the medium gain mode. When gain_t is lower than 19, the LNA operates in the low gain mode since the received signal is at a high level.

An initial value of the LNA is 3 (i.e., the high gain mode). An output gain of the AGC is controlled by the VGA and is determined in gain_t-LNA.

The LNA state trace index is given as the following equation.

LNA state trace index=initial gain value (dBm)−target gain value (dBm)−2×current gain value The LNA state is determined as the following equations.

High gain mode: LNA state trace index≦high gain LNA boundary value    1 medium gain mode: high gain LNA boundary value≦LNA state trace index≦low gain boundary value    2 low gain mode: LNA state trace index>low gain LNA boundary value    3

The LNA state determination value determining method of the commercial RF chip that supports multiple gain control modes will now be described with reference to FIG. 12.

Figure 12:
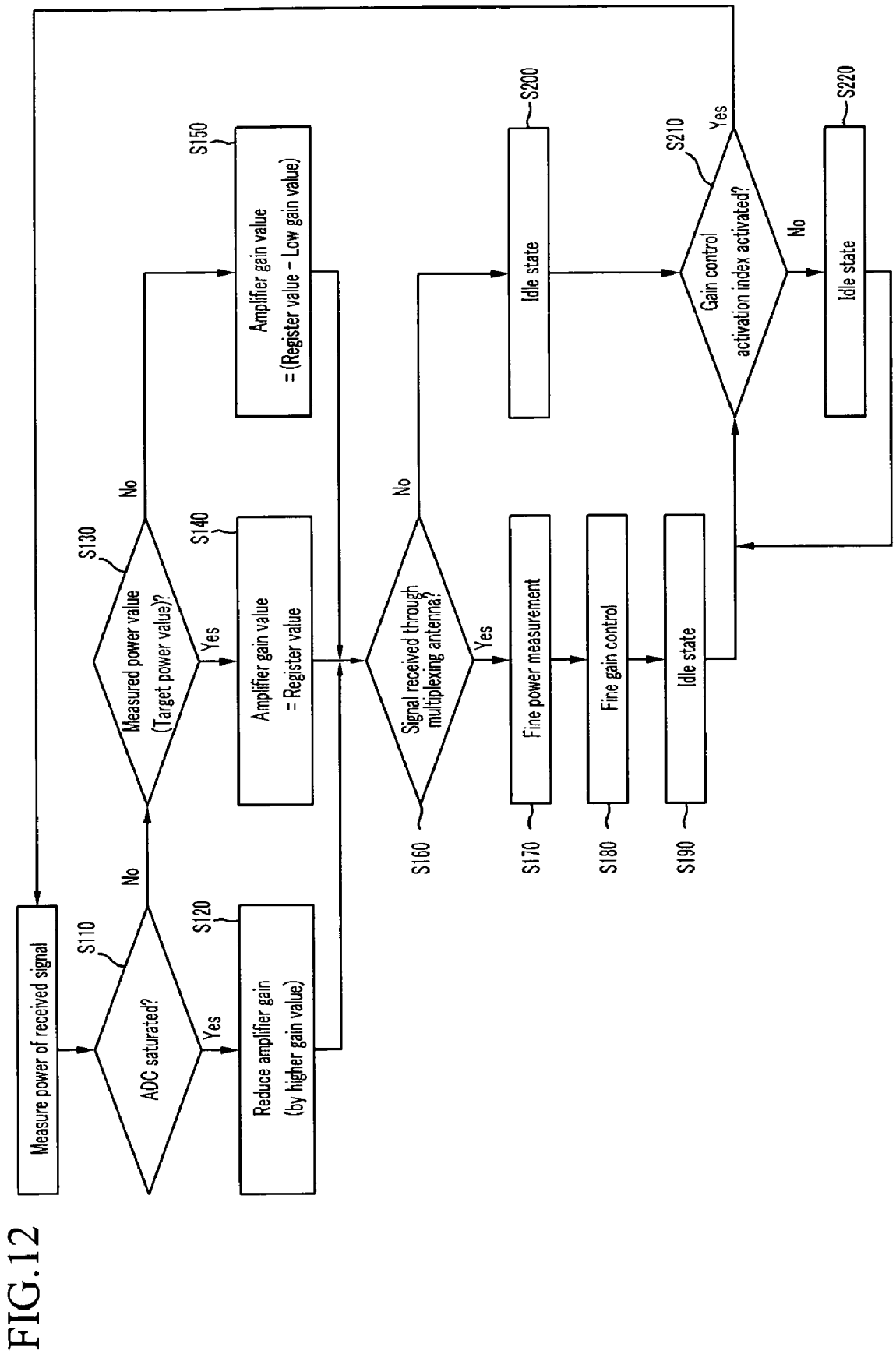
FIG. 12 shows a flowchart for determining the LNA gain according to the exemplary embodiment of the present invention.

FIG. 12 shows a flowchart for determining the LNA gain according to the exemplary embodiment of the present invention.

As shown in FIG. 12, when the automatic gain control mode is the commercial RF chip mode, the LNA state trace index is calculated by using the current gain value and the LNA state determination value. That is, a subsequent gain value is calculated based on the initial gain value and the target gain value, and the LNA state trace index is calculated by using the calculated subsequent gain value and the LNA initial value of the high gain mode.

A method for determining the subsequent LNA state may be determined as the above equations described in FIG. 11. The subsequent LNA state is determined based on the calculated LNA state trace index, and the determined subsequent LNA state and the subsequent gain value are applied to the gain value and the LNA state. The values applied to the gain value and the LNA state may be used to calculate another subsequent gain value.

The automatic gain control method will now be described in further detail. The power measuring unit 310 of the automatic gain controlling unit 300 measures power of a signal received through a plurality of antennas in step S100. The signal saturation detecting unit 400 determines in step S110 whether the ADC 200 is saturated.

When it is determined that the ADC 200 is saturated, the commercial RF chip 100 reduces the gain of the amplifier to a predetermined register value in step S120. The amplifier gain is reduced by a highest gain value among a plurality of register values.

When it is determined in step S110 that the ADC 200 is not saturated, it is determined in step S130 whether the power of the received signal measured by the power measuring unit 310 is greater than the target power value. When the measured power value is lower than the target power value, the amplifier gain value is set to be equal to a register value given after the signal power is applied to the received signal during a gain variation period, in step S140.

When the power value of the received signal is higher than the target power value, the amplifier gain value is obtained in step S150 by reducing the gain value set to be equal to the register value in step S140 by a predetermined low gain value. The register value is high enough so that the signal may change the gain.

When the amplifier gain value is determined in step S120, S140, or S150, it is determined in step S160 whether the received signal is received through the multiplexing antennas. When the multiplexing antennas are used, the gain of the received signal having the gain controlled by using the determined gain value is controlled. Accordingly, fine power of the signal is measured in step S170, and fine gain control is performed in step S180. Here, the fine gain control is performed according to the fine gain control loop shown in FIG. 3.

A difference between the power value measured in step S180 and the target power value is compensated, the gain is maintained until the signal is completely received, and the state is changed to the idle state in step S190. When it is determined in step S160 the multiplexing antennas are not used, the state is changed to the idle state in step S200 to await detection of a subsequent received signal.

Since there is a received signal when the gain control activation index of the idle state in step S190 or S200 is activated in step S210, the state is changed to the power measuring state to determine the LNA state determination value from the step S100 for measuring the received signal power.

An example of the gain value controlled by the automatic gain controlling device according to the exemplary embodiment of the present invention will now be described with reference to FIG. 13.

Figure 13:
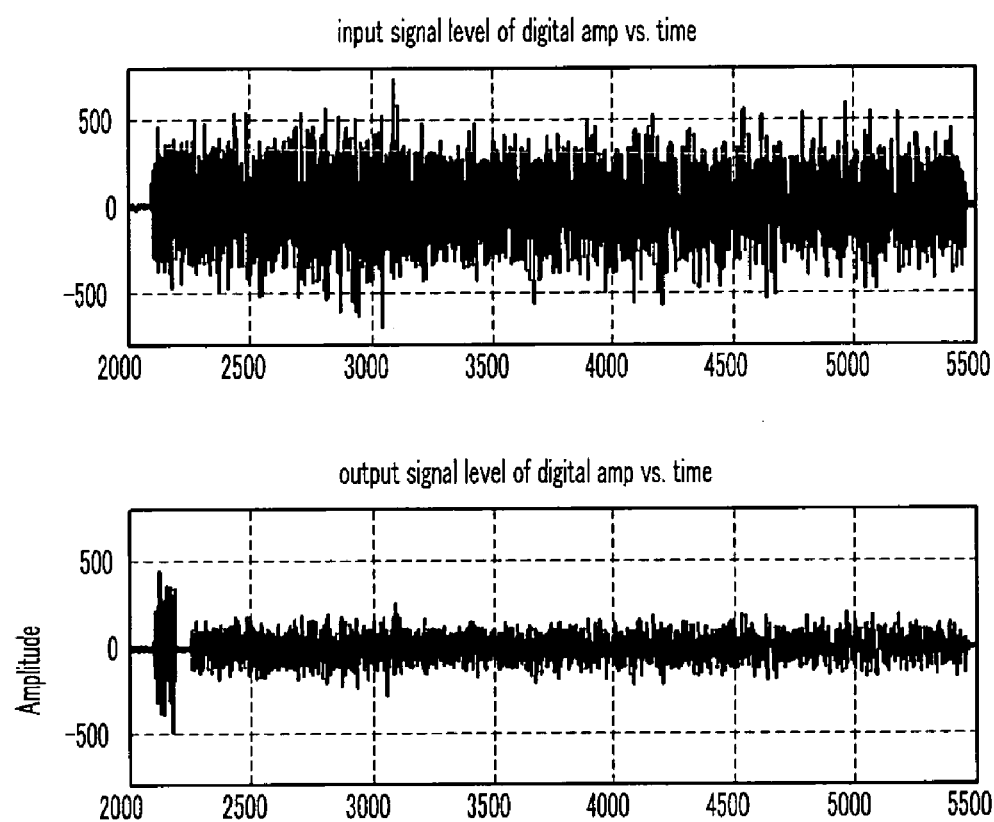
FIG. 13 shows an example of the gain value controlled to be in a desired level by the automatic gain controlling device according to the exemplary embodiment of the present invention.

FIG. 13 shows an example of the gain value controlled to be in a desired level by the automatic gain controlling device according to the exemplary embodiment of the present invention.

When 1000 packets are used in 27 dB according to the exemplary embodiment of the present invention, the upper part of the diagram in FIG. 3 shows an experimental result obtained in the conventional automatic gain control method, and the lower part of the diagram shows an experimental result obtained by using the automatic gain controlling device according to the exemplary embodiment of the present invention. When comparing the two parts of the diagram, the automatic gain control method achieves efficient and reliable wireless communication since the gain is controlled in a short time and a gain value is stably provided to the baseband according to the exemplary embodiment of the present invention.

The above-described methods and apparatuses are not only realized by the exemplary embodiment of the present invention, but, on the contrary, are intended to be realized by a program for realizing functions corresponding to the configuration of the exemplary embodiment of the present invention or a recording medium for recording the program.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

According to the exemplary embodiment of the present invention, in the wireless communication system having the multiplexing antennas, the gain control is repeatedly performed in the coarse gain control loop and the fine gain control loop is used, and therefore a stable and fine gain may be obtained.

In addition, a mode is set such that the commercial RF chip and the discrete RF module are selectively used based on the programmable register. When the commercial RF chip is used, the gain interval is variably controlled by using the method for determining the VGA gain and the LNA gain control state value. When the discrete RF module is used, a multiplier and an unnecessary lookup table may be eliminated since a digital variable gain controller is used, and hardware complexity may be reduced since a shift register is used.

In addition, since the absolute power values of the received I and Q values of the multiplexing antennas are compared and the greatest value among the compared values is converted into a logarithmic value, a maximum received power for gain update may be efficiently detected.

In addition, since the respective gain control value, initial gain value, target gain value, and automatic gain control mode may be set by a programmable register, various wireless communication systems having a single antenna or multiplexing antennas may be used.

What is claimed is:

1. An automatic gain control device for automatically controlling a gain of a plurality of first signals input through a plurality of antennas in a wireless communication system, the automatic gain control device comprising:
    a radio frequency receiver for receiving the first signals through the antennas, respectively controlling gains of the first signals, and outputting the first signals having the controlled gain as a plurality of second signals through a plurality of analog to digital converters (ADCs);
    a signal saturation detecting unit for outputting a saturation index determination value when the number of the first signals that are greater than a threshold value is found to be greater than a predetermined number; and
    a gain controlling unit for comparing power values of the first signals to detect a greatest power value from among the first signals and configured to output a gain value determined based on a detected greatest power value and the saturation index determination value to the radio frequency receiver,
    wherein when the saturation index determination value indicates that a number of saturated ADCs is greater than a saturation count reference value then the gain value is reduced,
    when the number of saturated ADCs is less than the saturation count reference value and when the detected greatest power value is higher than a target power value then the gain value is reduced,
    when the number of saturated ADCs is less than the saturation count reference value and when the detected greatest power value is lower than the target power value then the gain value is set to be equal to a register value,
    wherein the gain controller controlling unit comprises:
        a power measuring unit for comparing a plurality of absolute power values of the first signals, detecting the greatest absolute power value from among the compared absolute power values, and outputting the detected greatest absolute power value as a logarithmic power value;
        a low noise amplifier (LNA) state determining unit for calculating a low noise amplifier state control index based on a current-LNA state determination value and a current gain value, determining a subsequent LNA state determination value, and outputting the determined subsequent LNA state determination value as a gain control state determination value; and
        a gain determining unit for receiving the logarithmic power value output from the power measuring unit, the saturation index determination value input from the signal saturation detecting unit, the LNA state determination value, the LNA state determination value, a first gain control value, and a second gain control value, and outputting a finally controlled gain determination value.

2. The automatic gain control device of claim 1, wherein the gain determining unit controls a first gain when the saturation index determination value is received, and controls a second gain by a value obtained by subtracting the logarithmic power value from a predetermined gain value when the saturation index determination value is not received.

3. The automatic gain control device of claim 1, wherein the LNA determining unit receives the current gain value, the current LNA state value (here, the current LNA state value is determined by subtracting a target gain value from an initial gain value, and multiplying the subtracted value by the current gain value), a first gain LNA state boundary value, and a second gain LNA state boundary value, and outputs LNA state determination values in three modes.

4. The automatic gain control device of claim 3, wherein the LNA state determination values in the three modes comprise:
    a first LNA state determination value when a value obtained by adding the current gain value and the LNA state value is less than the second gain LNA boundary value;
    a second LNA state determination value when the first gain LNA state boundary value is greater than the current gain value, or a value obtained by adding the current gain value and the LNA state value is greater than the second gain LNA boundary value; and
    a third LNA state determination value when the first gain LNA state boundary value is greater than the current gain value.

5. The automatic gain control device of claim 4, wherein the first LNA state determination value is less than the second LNA state determination value, the second LNA state determination value is less than the third LNA state determination value, and the three gain control ranges are determined based on the three LNA state determination values.

6. The automatic gain control device of claim 5, wherein the radio frequency receiver comprises:
    a radio frequency receiving unit for converting the first signal received through the plurality of antennas into a baseband signal;
    a low noise amplifier for performing a first gain control for the first signal converted into the baseband signal, through the three gain control ranges; and
    a variable gain amplifier for performing a second gain control for the first signal in which the first gain control is performed by the low noise amplifier, and outputting it as a second signal.

7. The automatic gain control device of claim 6, wherein the three gain control ranges comprise:
    a first gain control mode for reducing a gain value by a first gain value based on a predetermined register value when the saturation index determination value is input from the signal saturation detecting unit;
    a second gain control mode for reducing the gain value by the register value when the saturation index determination value is not received and a power value of the measured second signal is less than a target power value; and
    a third gain control mode for further reducing the gain value controlled in the second gain control mode by a third gain value when the saturation index determination value is not received and the power value of the measured second signal is greater than the target power value.

8. The automatic gain control device of claim 7, wherein the first gain value and the third gain value are determined by programmable registers.

9. The automatic gain control device of claim 1, wherein the radio frequency receiver comprises a discrete radio frequency receiving unit for converting a first signal received through the plurality of antennas into a baseband signal.

10. The automatic gain control device of claim 9, further comprising a digital variable gain amplifier for adding a gain to the first signal converted into the baseband signal to convert the first signal into the second signal, and outputting the second signal.

11. The automatic gain control device of claim 10, for converting analog second signals into digital second signals.

12. An automatic gain control method for automatically controlling a gain of a plurality of signals input through a plurality of antennas through a plurality of analog to digital converters (ADCs) in a wireless communication system, the automatic gain control method comprising:
   detecting a greatest power value from among the signals received from the plurality of antennas, converting the detected greatest power value into a logarithmic power value, and outputting the converted power value;
   measuring the number of saturated ADCs;
   reducing a gain value when the number of saturated ADCs is greater than a saturation count reference value;
   diminishing the gain value when the number of saturated ADCs is less than the saturated count reference values along with when the detected greatest power value is higher than a target power value;
   setting the gain value to be equal to a register value when the number of saturated ADCs is less than the saturated count reference value along with when the detected greatest power value is lower than the target power value; and
   c) controlling gain of the signals based on the gain value.

13. The automatic gain control method of claim 12, further comprising outputting a low noise amplifier (LNA) state determination value based on a current gain value, a current LNA state value, a first LNA state boundary value, and a second LNA state boundary value.

14. The automatic gain control method of claim 13, wherein the step of outputting comprises:
   outputting a first LNA state determination value when a value obtained by adding the current gain value and the LNA state determination value is less than the second gain LNA state boundary value;
   outputting a second LNA state determination value when the first gain LNA boundary value is greater than the current gain value, or when the value obtained by adding the current gain value and the LNA state value is greater than the second gain LNA state boundary value; and
   outputting a third LNA state determination value when the current gain value is greater than the first gain LNA state boundary value.

15. The automatic gain control method of claim 13, wherein the outputting step comprises:
   measuring the first power of the received signal, and determining whether the saturation index determination value is output;
   ii) when the saturation index determination value is output, stopping measuring the power of the received signal, and performing a first gain control operation so that the gain of the received signal is reduced by a predetermined first gain; and
   iii) determining whether the received signal is received through a plurality of multiplexing antennas, and performing a second gain control operation for the received signal reduced by a register value when the received signal is received through the plurality of multiplexing antennas.

16. The automatic gain control method of claim 15, further comprising, when the saturation index determination value is not output in i):
   determining whether the measured power value of the received signal is less than a target power value;
   when the power value of the received signal is less than the target power value, applying the gain value of the received signal to the received signal during a gain variation period, and establishing the gain value to be equal to an updated register value.

17. The automatic gain control method of claim 16, further comprising, when the power value of the received signal is greater than the target power value,
   establishing the gain value of the received signal to be a value obtained by subtracting a second gain from the predetermined first gain.

18. The automatic gain control method of claim 15, wherein iii) comprises:
   measuring a second power value of the received signal reduced by the register value; and
   compensating a difference between the measured second power value and the established target power value, and maintaining the gain of the received signal.

* * * * *